(12) United States Patent
Kubis et al.

(10) Patent No.: US 11,362,200 B2
(45) Date of Patent: *Jun. 14, 2022

(54) ENHANCED CASCADE FIELD EFFECT TRANSISTOR

(71) Applicant: Purdue Research Foundation, West Lafayette, IN (US)

(72) Inventors: Tillmann C. Kubis, West Lafayette, IN (US); James Charles, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/435,457

(22) Filed: Jun. 7, 2019

(65) Prior Publication Data

US 2019/0378919 A1    Dec. 12, 2019

Related U.S. Application Data

(60) Provisional application No. 62/682,665, filed on Jun. 8, 2018.

(51) Int. Cl.
   *H01L 29/66*    (2006.01)
   *H01L 29/15*    (2006.01)

(52) U.S. Cl.
   CPC ...... *H01L 29/66977* (2013.01); *H01L 29/152* (2013.01)

(58) Field of Classification Search
   CPC ............. H01L 27/0886; H01L 27/0924; H01L 29/41791; H01L 29/785; H01L 29/66977; H01L 29/152

(Continued)

(56) References Cited

U.S. PATENT DOCUMENTS 9,076,813 B1 *   7/2015   Lee .................. H01L 21/30612
10,763,367 B2 *  9/2020   Kubis ................... H01L 29/785
(Continued)

OTHER PUBLICATIONS

Kim, N. S. et al., Leakage current: Moore's law meets static power, Computer 36, 2003, pp. 68-75.

(Continued)

*Primary Examiner* — Quoc D Hoang
(74) *Attorney, Agent, or Firm* — Purdue Research Foundation (57) ABSTRACT

A field-effect transistor (FET) includes a fin, an insulator region, and at least one gate. The fin has a doped first region, a doped second region, and an interior region between the first region and the second region. The interior region is undoped or more lightly doped than the first and second regions. The interior region of the fin is formed as a superlattice of layers of first and second materials alternating vertically. The insulator layer extends around the interior region. The gate is formed on at least a portion of the insulator region. The insulator layer and the gate are configured to generate an inhomogeneous electrostatic potential within the interior region, the inhomogeneous electrostatic potential cooperating with physical properties of the superlattice to cause scattering of charge carriers sufficient to change a quantum property of such charge carriers to change the ability of the charge carriers to move between the first and second materials.

16 Claims, 6 Drawing Sheets

(58) Field of Classification Search
USPC .......................................................... 257/24
See application file for complete search history.

(56) References Cited

U.S. PATENT DOCUMENTS

| | | | |
|---|---|---|---|
| 2015/0179800 A1 | 6/2015 | Biswas | |
| 2015/0340489 A1 | 11/2015 | Xiao | |
| 2017/0243941 A1* | 8/2017 | Yeh | H01L 21/823878 |
| 2019/0378919 A1 | 12/2019 | Kubis | |

OTHER PUBLICATIONS

Kao, J. et al., Subthreshold Leakage Modeling and Reduction Techniques [IC CAD tools], in IEEE/ACM International Conference on Computer Aided Design, ICCAD 2002, pp. 141-148. doi:10.1109/ICCAD.2002.1167526.

Ionescu, A. M. & Riel, H., Tunnel Field-effect Transistors as Energy-efficient Electronic Switches, Nature 479, 2011, pp. 329.

Appenzeller, J. et al., Band-to-Band Tunneling in Carbon Nanotube Field-Effect Transistors. Phys. Rev. Letters 93, 2004, 196805.

Appenzeller, J. et al., Comparing Carbon Nanotube Transistors—the ideal choice: a novel tunneling device design, IEEE Trans. Electron Devices, 52, 2005, pp. 2568-2576.

Seabaugh, A. C. & Zhang, Q., Low-Voltage Tunnel Transistors for Beyond CMOS Logic, Proc. IEEE 98, 2010, pp. 2095-2110.

Lu, H. & Seabaugh, A., Tunnel Field-Effect Transistors: State-of-the-Art, IEEE J. Electron Devices Soc. 2, 2014, pp. 44-49.

Teherani, J. T. et al., Auger generation as an intrinsic limit to tunneling field-effect transistor performance, J. Appl. Phys. 120, 2016, 084507.

Jirauschek, C. & Kubis, T., Modeling techniques for quantum cascade lasers, Appl. Phys. Rev. 1, 2014.

Bai, Y., et al., Quantum cascade lasers that emit more light than heat, Nat. Photonics 4, 2010, pp. 99.

Zhang, K. et al., Interlayer Transition and Infrared Photodetection in Atomically Thin Type-II MoTe2/MoS2 van der Waals Heterostructures. ACS Nano 10, 2016, pp. 3852-3858.

Wang, K.-C. et al. Control of interlayer physics in 2H transition metal dichalcogenides, J. Appl. Phys. 122, 2017, 224302.

* cited by examiner

ENHANCED CASCADE FIELD EFFECT TRANSISTOR

This application claims the benefit of U.S. provisional patent application Ser. No. 62/682,665, filed Jun. 8, 2018, the entirety of which is incorporated herein by reference.

FIELD

The present invention relates generally to semiconductor devices, and more particularly, to field effect transistors.

BACKGROUND

The Metal-Oxide-Semiconductor Field-Effect Transistor (MOSFET) is by far the most common transistor in digital circuits. Because billions of MOSFETs can be included in a memory chip or microprocessor, developments of MOSFET technology often involve the reduction in size or scaling of MOSFET devices while maintaining performance characteristics.

The scaling of Metal-Oxide-Semiconductor Field-Effect Transistor (MOSFET) has reached sub-10 nm range. However, further reducing the transistor size is challenged by the power consumption. To address this, a smaller subthreshold swing (SS) is the key to reducing the supply voltage and the subthreshold leakage current. The SS of a MOSFET is generally a characterization of the amount of voltage necessary to change the current flow by a decade. A reduced supply voltage and a reduced subthreshold leakage current are essential for low power electronics.

The SS of conventional MOSFETs is fundamentally limited to a minimum of 60 mV/decade. However, there have been proposed devices that promise a subthreshold swing of less than 60 mV/decade. These are devices based on impact ionization, ferroelectric dielectrics, mechanical gates and band-to-band tunneling. Tunneling field effect transistors (TFETs) are particularly promising since they do not suffer from delays caused by positive feedback that is common in the other device concepts. However, despite many predictions of outstanding TFET performance and more than a decade of considerable research efforts worldwide, most experimental TFETs underperform conventional MOSFETs. TFETs with an SS below 60 mV/decade and a sufficiently large ON current have not been demonstrated.

There is evidence that the TFET-typical switching mechanism by tuning the alignment of valence and conduction band is insufficient to maintain a sufficient ON current and low SS: Incoherent scattering mechanisms such as Auger recombination, electron scattering on phonons and impurities are supporting the band tail formation that eventually spoils a rapid switching behavior.

There exists a need, therefore, for an improvement to field effect transistor (FET) and TFET performance that reduces the impact of the band tail formation on the leakage current and increases the ON/OFF current density ratio significantly.

SUMMARY

At least some of the embodiments described herein address the above-stated need by introducing a FET device that incorporates additional switching mechanisms. The FET device uses tuned electrostatic potential across a superlattice to exploit such mechanisms.

A first embodiment is a field-effect transistor (FET) that includes a fin, an insulator region, and at least one gate. The fin has a doped first region, a doped second region, and an interior region between the first region and the second region. The interior region is undoped or more lightly doped than the first region and the second region. The interior region of the fin is formed as a superlattice of layers of first and second materials alternating vertically. The insulator layer extends around the interior region. The at least one gate is formed on at least a portion of the insulator region. The insulator layer and the at least one gate are configured to generate an inhomogeneous electrostatic potential within the interior region, the inhomogeneous electrostatic potential cooperating with physical properties of the superlattice to cause scattering of charge carriers sufficient to change a quantum property of such charge carriers to change the ability of the charge carriers to move between the first and second materials.

The use of the inhomogeneous electric field to change the ability of the charge carriers to move between the first and second materials can be used as an additional switching mechanism for current flow between the first region and the second region, which enhances the general switching mechanisms already present in FETs.

The above-described features and advantages, as well as others, will become more readily apparent to those of ordinary skill in the art by reference to the following detailed description and accompanying drawings.

DETAILED DESCRIPTION

Figure 1:
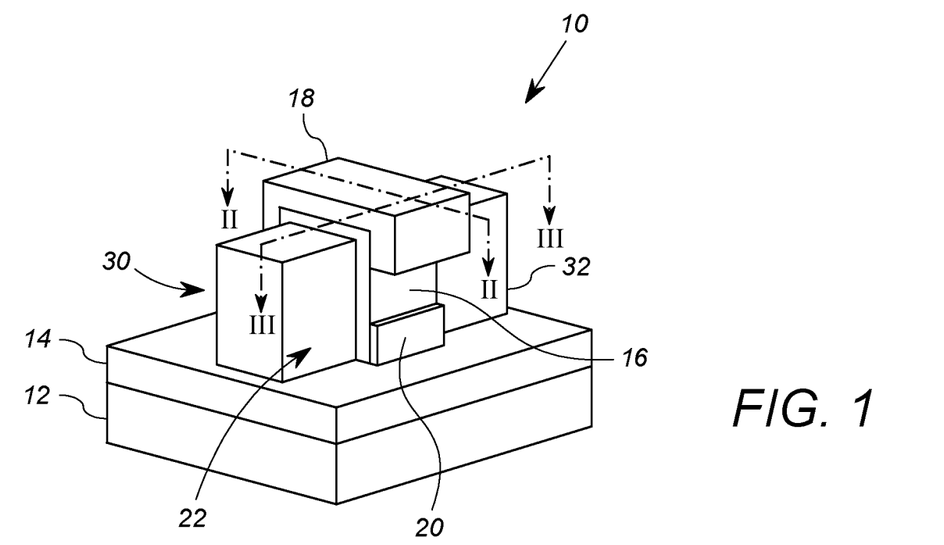
FIG. 1 shows a representative perspective view of a FET according to a first embodiment.
Figure 2:
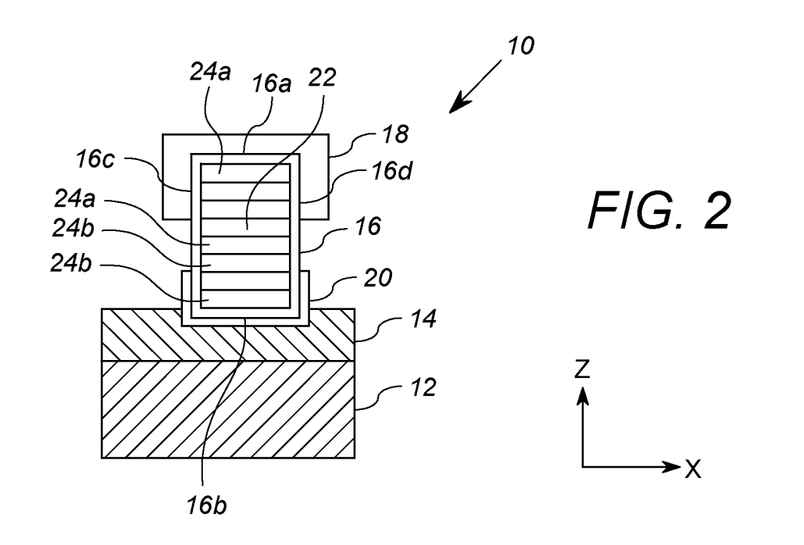
FIG. 2 shows a cross-sectional view of the FET taken along section II-II of FIG. 1.
Figure 3:
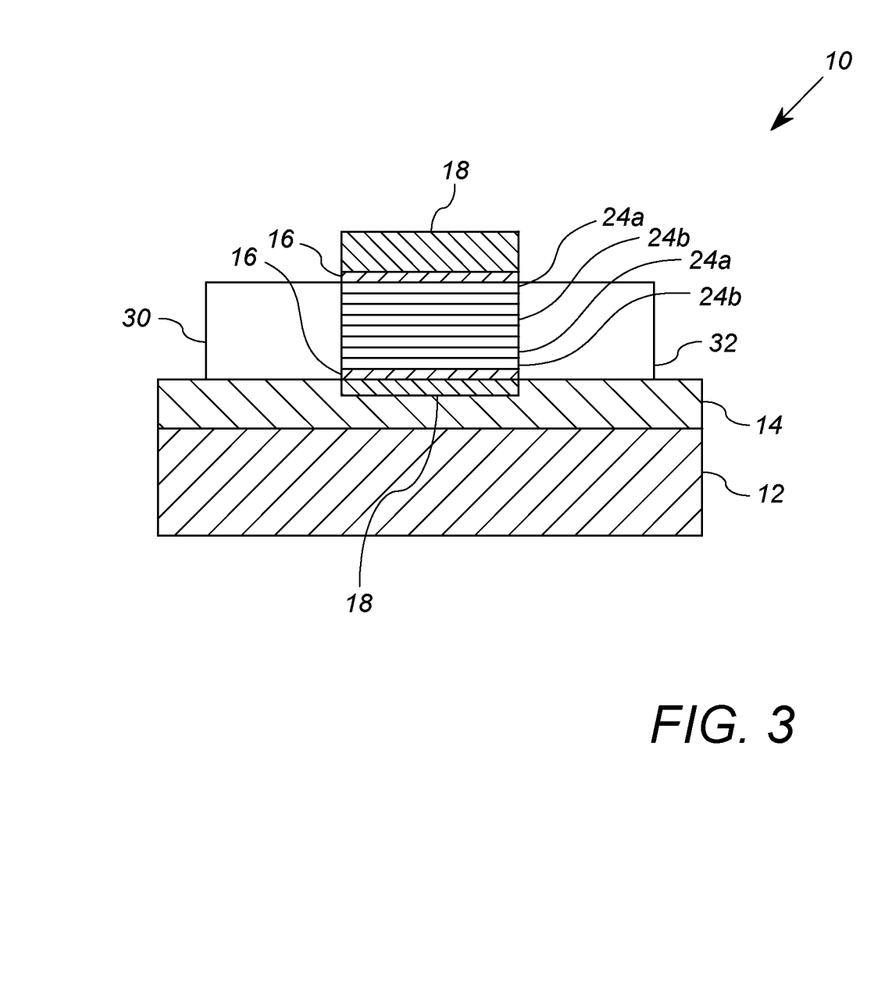
FIG. 3 shows a cross-sectional view of the FET taken along section III-III of FIG. 1.

FIG. 1 shows a perspective view of an exemplary embodiment of a cascade FET 10 according to a first embodiment of the invention. FIG. 2 shows a cutaway view taken along line II-II of FIG. 1, and FIG. 3 shows a cutaway view taken along line III-III of FIG. 1. It will be appreciated that the relative sizes of layers and regions may be exaggerated for clarity of exposition.

With simultaneous reference to FIGS. 1 to 3, the FET 10 is disposed on a buried oxide layer 14, which in turn is disposed above a substrate 12. The FET 10 in this embodiment includes a fin 22, an insulator region 16, and upper and lower gates 18, 20, respectively. The fin 22 has a doped first region 30, a doped second region 32, and an interior region 24 between the first region 30 and the second region 32. The interior region 24 is covered by the insulator 16 and/or gates 18, and 20 in FIG. 1, but is shown in FIGS. 2 and 3. The interior region 24 is formed of a superlattice having alternating layers 24a, 24b.

The alternating layers 24a, 24b of the interior region/superlattice 24 alternate in the vertical or z-direction, which is perpendicular the current flow direction or y-direction. As will be discussed in further detail, the alternating layers 24a, 24b are layers of different materials, wherein particles (i.e. charge carriers) carry a measurable property (e.g. quantum characteristic) that is different in the two materials. For example, the measurable property may be energy, momentum, spin, chirality, or being in the valence or conduction band. This measurable property should be a property that effectively does not change during the coherent propagation of the particle in its respective layer 24a or 24b.

In general, the two materials may be selected from two different semiconductors, for example, InAs and GaSb, or alternatively may be based on the same semiconductor, but have been treated in a way that causes quantum characteristics of the particles in alternating layers to differ. In other words, the quantum property of the starting semiconductor material may be tuned to form layers of alternating quantum properties. For example, the two materials of the alternating layers may be the same semiconductor base, but are lightly doped in alternating layers in different ways. In another alternative, the same semiconductor base material be used to form a lattice of alternating layers having alternating spin characteristics, using an antiferromagnetic oxide, not shown, surrounding the device 10 to induce alternating spin. The alternating spin is based on the respective spin polarization of the antiferromagnetic oxides that induces that polarization to the closest particular layers 24a or 24b. Nevertheless, the use of different semiconductor base materials in alternating layers 24a, 24b is a flexible and useful way to achieve alternating layers of materials having particles with at least one different quantum characteristic that may be manipulated to provide the cascade switching mechanisms described below in connection with FIGS. 4 and 5.

In any event, the alternating layers may be made from InAs and GaSb, InAs and AlSb, InAs and GaInSb, InAsSb and InSb, InAlN and GaN, AlGaAs and AlAs, AlGaAs and GaAs, or ZnSe and ZnTe. In other embodiments, the superlattice is formed from metal dichalcogenides, phosphorene, graphene, silicone, germanene, stanine, MoS2/MoTe2, SiGe/Si, metal oxide, group IV semiconductor material, group III/V semiconductor material, or group II/VI semiconductor material.

In this embodiment, the first region 30 is N+ doped, and the second region 32 is P+ doped. Preferably, the first region 30 should be of the same material as the layers 24a, and the second region should be of the same material as the layers 24b. Thus, either or both of the first region 30 and second region 32 may be InAs, GaSb, AlSb, GaInSb, InAsSb, InSb, InAlN, GaN, AlGaAs, AlAs, GaAs, ZnSe, ZnTe, SiGe, Si, InAs/GaSb, InAs/AlSb, InAs/GaInSb, InAsSb/InSb, InAlN/GaN, AlGaAs/AlAs, AlGaAs/GaAs, ZnSe/ZnTe, metal dichalcogenides, phosphorene, graphene, silicone, metal oxide, group IV semiconductor material, group III/V semiconductor material, group II/VI semiconductor material, germanene, stanine, MoS2/MoTe2, or SiGe/Si.

The layers 24a, 24b are undoped, or lightly doped in comparison the first region 30 and the second region 32. Each of the first region 30 and second region 32 may serve as a source or a drain of the FET 10. The interior region/superlattice 24 serves as the channel of the FET 10. It will be appreciated that the FET 10 will typically also include conductive source and drain contacts, not shown, but which are operably coupled to the first region 30 and second region 32.

The interior region 24 is surrounded by the insulator layer 16, also referred to herein as a dielectric spacer, in a manner not unlike a traditional fin FET. The dielectric spacer 16 has a top layer 16a that extends laterally across (in the x-direction) and adjacent to the top surface of the interior region 24, a bottom layer 16b that extends laterally across and adjacent to the bottom surface of the interior region 24, and sides 16c and 16d that extend down (in the z-direction) and adjacent to opposite sides of the interior region 24 of the fin 22. In this embodiment, the top layer 16a, bottom layer 16b and side layers 16c, 16d have uniform thicknesses. As will be discussed below, however, such thicknesses may be varied to achieve desired wave function switching behavior in the FET 10.

The first gate 18 and the second gate 20 may suitably be formed from metal or from a heavily doped semiconductor material. In this embodiment, the first gate 18 extends over the top layer 16a of the dielectric spacer 16, and the second gate 20 extends over a lower portion of the dielectric spacer 16. To this end, the first gate 18 is an-inverted U-shaped conductive element that extends laterally (in the x-direction) over and against the top layer 16a of the dielectric spacer 16 and partly down each side layer 16c, 16d of the dielectric spacer 16. Similarly, the second gate 20 is a U-shaped conductive element that extends laterally (in the x-direction) under and against the bottom layer 16b of the dielectric spacer 16 and partly up each side of the dielectric spacer 16.

In this embodiment, the upper gate 18 and the lower gate 20 have different thicknesses, or at least are configured to provide a non-homogeneous electrostatic potential within the interior region 24 in a switchable manner. In general, depending on whether a sufficient switching voltage is present on the upper gate 18 and lower gate 20, the dielectric spacer or insulator layer 16 and the gates 18, 20 are configured to generate an inhomogeneous electrostatic potential within the interior region that cooperates with physical properties of the superlattice 24 to cause scattering of charge carriers sufficient to change a quantum property of such charge carriers. This change in the quantum property of the charge carriers changes the ability of the charge carriers to move between the first and second materials, e.g. between the layers 24a, 24b.

Specifically, as discussed above, the two materials of the alternating layers 24a, 24b host particles that can propagate and carry a measurable property (e.g. energy, momentum, spin, chirality, being in valence or conduction band etc.) that effectively does not change during the propagation in each respective material of the FET 10. As also discussed above, this measurable property (i.e. quantum characteristic) of the particles in the materials of the alternating layers 24a, 24b has to differ. As a result, the particles (i.e. charge carriers) have to change this property when they transfer from one layer 24a to the other 24b (and vice versa). Given that the particles cannot change the property in each layer 24a, 24b alone, the property change has to happen during the transfer between the layers 24a, 24b. Typically, this change involves scattering on a third particle type. For instance, for electrons or holes, the third particle type can be collective oscillations of atoms (i.e. phonons).

Such scattering is proportional to the overlap of the particle wave functions in each of the two materials (i.e. layers 24a, 24b). This overlap is switchable between the delocalized and localized wave functions.

Figure 4:
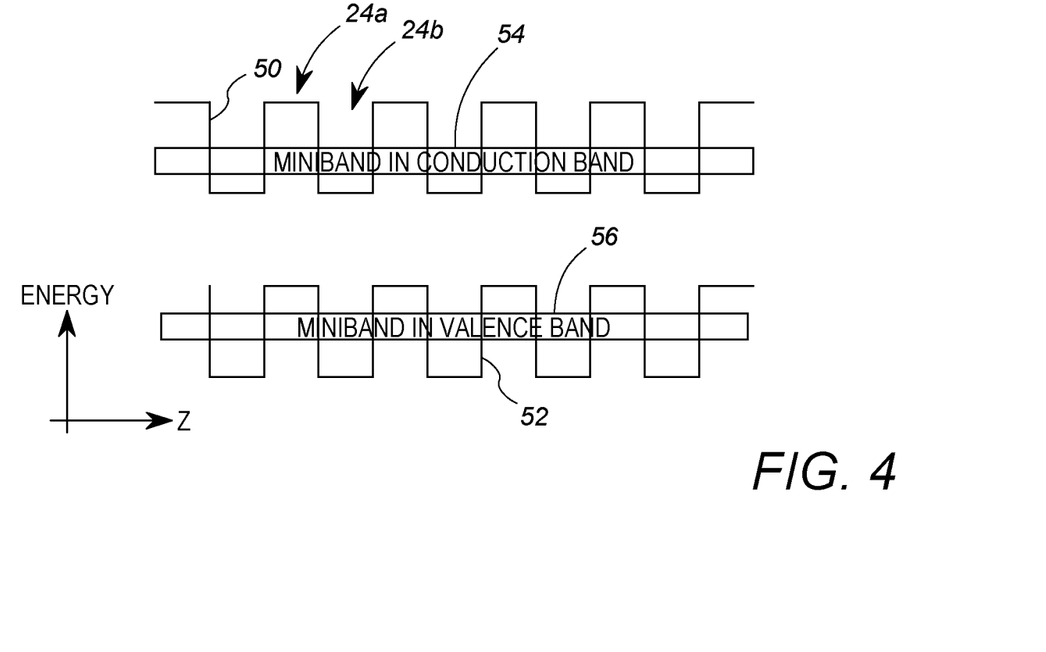
FIG. 4 shows a graph of the band structure profile of the FET of FIG. 1 in the ON state.
Figure 5:
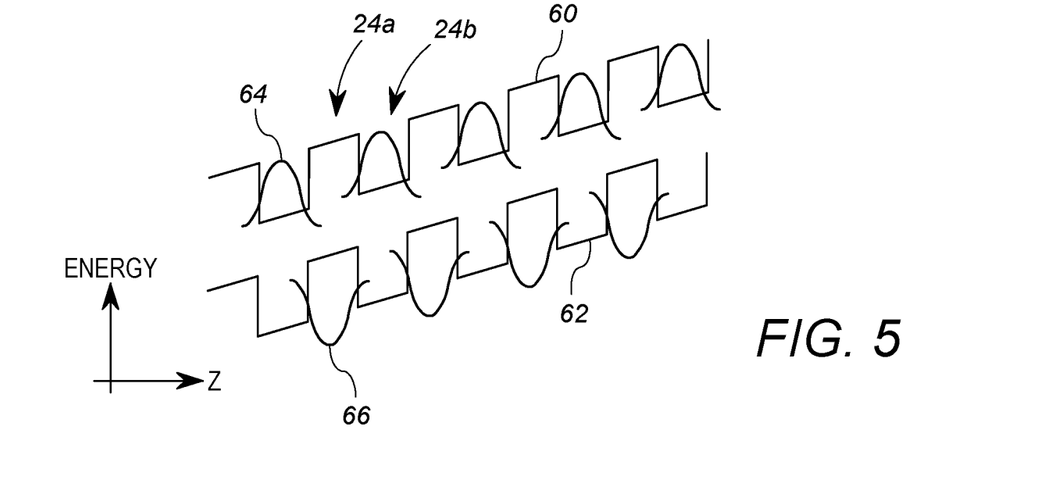
FIG. 5 shows a graph of the band structure profile of the FET of FIG. 1 in the OFF state.

An example of this phenomenon is shown in FIGS. 4 and 5. In the example of FIGS. 4 and 5, the quantum characteristic of the two layers 24a, 24b is whether the charge carriers are in the conduction band or valence band. In this example, the superlattice of the interior portion 24 is configured as a type II superlattice, and the switching operation of the FET is based on tunneling, such as in a TFET. However, it will be appreciated that principles of localized and delocalized wave functions discussed below may readily be adapted to other quantum characteristics with proper materials selection and tuning of the electrostatic potential imposed by the gate subjected to an ON voltage.

In particular, FIG. 4 shows a graph of the band structure profile (and wave function) in the ON-state of the FET 10. The alternating layers 24a, 24b of the FET 10 in this TFET example have alternating band offsets which lead to the superlattice Type II typical alternating conduction band profile 50, and valence band profile 52. In this setting, the electronic states of conduction and valence band form minibands 54, 56, respectively, that are delocalized over the total extent of the FET in z-direction.

As demonstrated by FIG. 4, the thicknesses of the individual layers 24a, 24b of the superlattice 24 define the confinement energies of the valence and conduction band states. The energy of these states determines which states are occupied and therefore contribute to the FET 10 operation. In the ON state, the energies of all occupied electron states in the conduction band (similar for the hole states in the valence band) lie within an energy window of 25 meV, i.e. they are effectively degenerate within the thermal broadening at room temperature.

Other temperatures require different energy windows (following kBT) that allow them to form minibands in the conduction and valence band (see FIG. 4). Miniband states are delocalized across the total height of the superlattice 24 and correspondingly, the overlap between the valence and conduction band wave functions is large (see FIG. 4). In this situation, tunneling between conduction and valence band is pronounced, due to the strong overlap of wave functions and the resulting strong scattering between them, due to the energy alignment similar to standard FETs, and due to stronger pronounced band tails (compared to nanowires) that are typical of ultrathin body (UTB) configurations. The band tails significantly support tunneling between bands. Also, the density of states in UTB minibands is larger than in nanowires which further boosts the current density in this ON state.

FIG. 5 shows the wave function and band profile in the OFF-state of the FET 10. The alternating layers 24a, 24b of the FET 10 have alternating band offsets which lead to the superlattice Type II typical alternating band profile (60, 62 in FIG. 5). In this setting, the superlattice structure faces a finite electric field in z-direction that adds to the material-given alternating conduction and valence band profiles. The electronic states of conduction and valence band are localized within individual layers In the OFF state, the energies of electron and hole like states 64, 66 in the conduction and valence band 60, 62, respectively are separated by more than 25 meV. Then the electrons and holes are confined in individual layers, as shown in FIG. 5.

Since the materials of these layers 24a, 24b are chosen to be a type II superlattice, the electron and hole wave functions are localized in distinct material layers. This results in a suppressed (OFF) source-drain current density: The small or negligible overlap of electron and hole wave functions makes a direct tunneling between the bands very unlikely. This is part of normal TFET operation. However, this small band-to-band tunneling probability in this embodiment is further reduced due to the fact the layers 24a, 24b effectively operated as a set of nanowires. In other words, the isolated layers 24a, 24b of the superlattice 24 act like nanowires with a reduced density of states and reduced band tails. The smaller density of states can cause less possible current density. The effective band gap of nanowire states is larger than that of the minibands in the UTB-like ON configuration thanks to the enhanced quantum mechanical confinement of nanowires. This again reduces the tunneling current in the OFF state of the FET 10.

The switching between minibands (ON state of FIG. 4) and nanowire-like isolated layer states (OFF state of FIG. 5) is done with an applied electric field perpendicular to the transport direction, via gates 18, 20. This mechanism is frequently used in cascade devices, as discussed, for example, in Jirauschek, C. & Kubis, T. Modeling techniques for quantum cascade lasers. *Appl. Phys. Rev.* 1, (2014), and Bai, Y., Slivken, S., Kuboya, S., Darvish, S. R. & Razeghi, M. Quantum cascade lasers that emit more light than heat. *Nat. Photonics* 4, 99 (2010), both of which are incorporated herein by reference.

The respective energy shift of conduction and valence bands of individual layers depends on their relative position within that field in the z-direction. Depending on the desired switching configuration, i.e. whether the ON state is achieved with vanishing or with a finite gate field, the layers 24a, 24b have equal (for ON at 0 gate field) or different (for ON at finite gate field) thicknesses and accordingly equal or different confinement energies. In any case, whether the state energies are equal or different in the field free case, the inhomogeneous potential in the z-direction, caused by the configuration of the gate 18, 20 in this embodiment, allows to tune the states to either all match in energy (ON state) or to differ by more than the thermal broadening (OFF state). The conduction and valence minibands of the n-type and p-type materials have to be aligned in the ON state and misaligned in the OFF state to synchronize the cascade switching and the FET switching and benefit from constructive interference of both effects.

Referring again generally to FIGS. 1 to 3, as discussed above, the inhomogeneous electrostatic potential provided by the gates 18, 20 (in the ON state) cooperates with physical properties of the superlattice 24 to change the overlap of the wave functions of the first and second materials 24a, 24b in comparison to the absence of the inhomogeneous electrostatic potential (the OFF state), sufficient to change the conductance between the doped first region and the doped second region. In one example, the inhomogeneous electrostatic potential (i.e. from the gate 18, 20) cooperates with the physical properties of the superlattice 24 to cause scattering of the charge carriers on phonons. In another embodiment, roughness at boundaries between the layers 24a, 24b cooperates with the inhomogeneous electrostatic potential to cause scattering of the charge carriers. More specifically, the inhomogeneous electrostatic potential creates delocalization of the wave functions, which in turn cooperates with the rough interfaces to cause scattering.

In yet another embodiment, the impurities in at least one of the first and second layers 24a, 24b of the superlattice 24 cooperates with the inhomogeneous electrostatic potential to cause scattering of the charge carriers. More specifically, the inhomogeneous electrostatic potential creates delocalization of the wave functions, which in turn cooperates with the impurities to cause scattering.

The cascade FET 10 otherwise has some overlapping attributes with known fin FET designs, such as that disclosed in U.S. Patent Application publication no. 2015/0340489, which is incorporated herein by reference. However, the FET has substantial differences from prior art fin FET and other FET designs, including the features described above.

Figure 6:
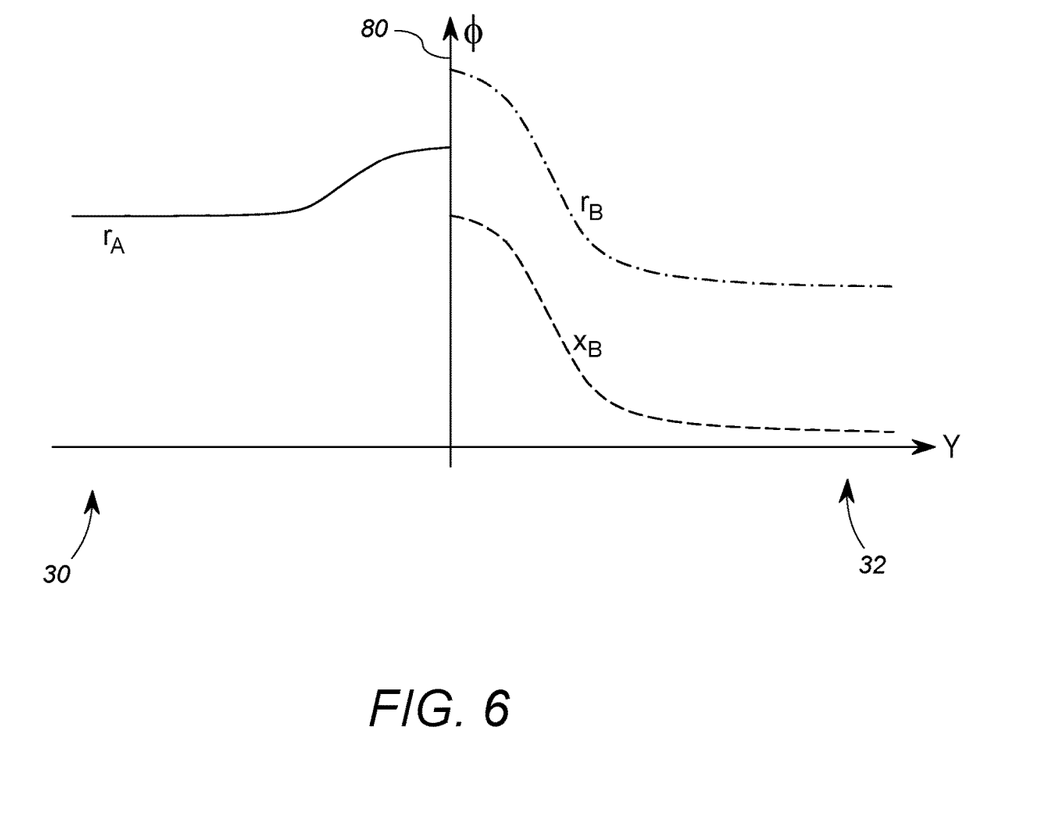
FIG. 6 shows a graph of the electron conduction band minimum as a function of the lateral position between the doped regions of the FET of FIG. 1.

Another example of using scattering of particles to ensure passage between layers of the superlattice 24 (e.g. when a gate potential is applied) is described in conjunction with FIG. 6. FIG. 6 shows a graph of the conduction band minimum as a function of the lateral position between the doped first region 30 and the doped second region 32, with the interface 80 representing schematically the interfaces within the internal portion 24 between layers 24a and 24b. In FIG. 6, the materials are selected such that region 30 has that conduction band minimum at the F point and region 32 at the X point. As discussed above, the layers 24a are of the same material as the doped first region 30, and the layers 24b are of the same material as the doped second region 32, and thus the interface 30 includes the vertical transitions between adjacent layers 24a, 24b.

The electronic property that is changed in the transition between materials of layers 24a and 24b in FIG. 6 is the conduction band valley the electrons are located in. The assumption, which is based on the selection of the materials used for layers 24a, 24b (and regions 30, 32 respectively), is that the material of layer 24a/region 30 has the conduction band minimum in the Gamma point $\Gamma_A$, whereas the material of layer 24b/region 32 has the Gamma valley $\Gamma_B$ higher in energy than the X valley $X_B$. The band alignment between the two materials gives a step at the material interface 80.

Because of this step function, Gamma electrons of the material of layer 24a/region 30 cannot propagate into the Gamma valley of the material of layer 24b/region 32 due to the potential barrier maintained by the band offset between those two materials. Moreover, the Gamma electrons of the material of layer 24a/region 30 can only enter the lower X valley of the material of layer 24b/region 32, and hence maintain a finite transistor current, when those Gamma electrons change their momentum during the transition at the interface 80. The scattering probability for that momentum change depends on the wave function overlap and is therefore subject to the wave function switching similar to that described above in connection with FIGS. 4 and 5.

Figure 7:
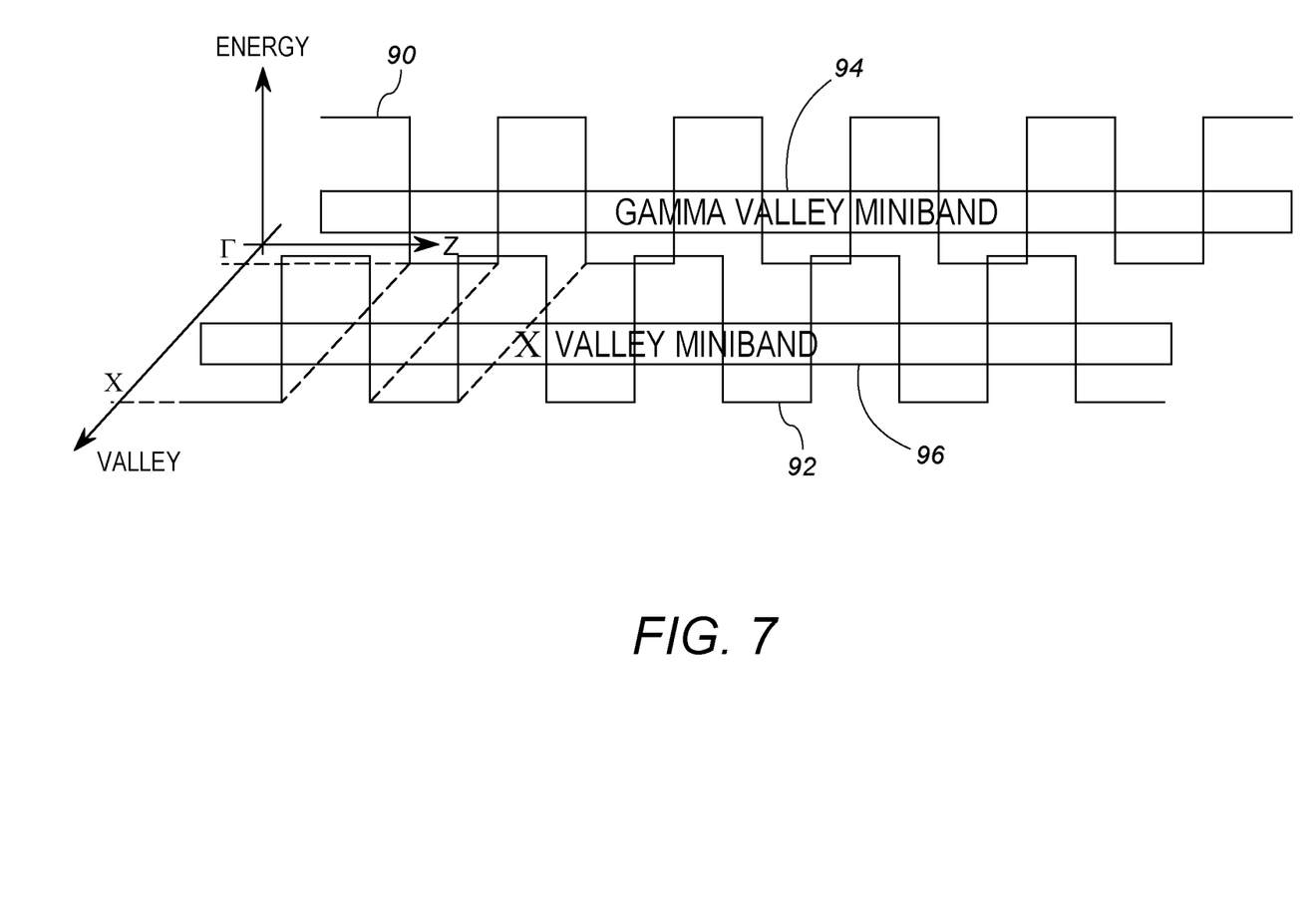
FIG. 7 shows a graph of the valley band structure profile of the FET of FIG. 1 in the ON state.

More specifically, FIG. 7 shows a graph of the valley band structure profile of the FET 10 in the ON state wherein the wave function is delocalized in the layers 24a, 24b, and thus allows the Gamma electrons to change their momentum via incoherent scattering to move through the boundary 80. FIG. 7 is thus analogous to FIG. 4 of the TFET example. FIG. 7 shows a typical alternating gamma valley band profile 90, and x valley band profile 92. In this setting, the electronic states of gamma valley and x valley bands form minibands 94, 96, respectively, that are delocalized over the total extent of the FET in z-direction. The delocalized wave functions shown in FIG. 7 enhance movement electrons between the layers 24a, 24b. Note again that the standard FET operation adds to the switching of the device 10.

As discussed above, in order to switch the wave functions as shown in FIGS. 4 and 5, an inhomogeneous electrostatic potential must be applied to the layers 24a, 24b in the ON state, and no electrostatic potential (or some other electrostatic potential) is applied to the layers 24a, 24b in the off state. To this end, the first gate 18 and the second gate 20 have different thicknesses, or at least are configured to provide a non-homogeneous electric field and electrostatic potential within the interior region 24 when a gate voltage is applied thereto.

Referring to the general operation of the device, the FET 10 operates to controllably allow current to flow from a source to drain depending on whether a voltage is applied to the first gate 18 and second gate 20. The FET 10 operates to switchably convey current, in part, like a traditional FET. Thus, in a traditional N-type FET 10, the application of a gate voltage greater than a threshold ($V_G > V_{TH}$) to the first gate 18 and second gate 20 causes current to flow between the first region 30 (e.g. source) and the second region 32 (e.g. drain). When no gate voltage is present ($V_G = 0$), then little or no current (e.g. leakage current) flows between the first region 30 and the second region 32. In a P-type FET 10, then current flows in the absence of gate voltage ($V_G = 0$) and little or no current flows when the gate voltage exceeds a threshold ($V_G > V_{TH}$).

In contrast to a traditional FET, however, the FET 10 has additional operational features as discussed above. In general, the additional switching mechanisms described above in connection with FIGS. 4 and 5 augment the switching mechanism of traditional FET operation. When the gate voltage is applied, the gates 18, 20 expose the superlattice 24 to an inhomogeneous electrostatic potential. Because of the selection of the first and second materials of the superlattice, the inhomogeneous electrostatic potential changes the wave functions of the charge carriers. The changed wave function is delocalized within the layers 24a, 24b, which increases the probability of the charge carriers scattering such that the conservation of the quantum characteristics (which are different in charge carriers of the two layers) that would otherwise prevent charge carriers moving between layers is reduced to allow movement between layers 24a, 24b. This increases current flow from the first region 30 to the second region 32.

At least some advantageous features of the FET 10 arise from the fact that the FET is inhomogeneous perpendicular to the transport direction, or in other words, the z-direction. As a result, the ON voltage applied to the gate can operate to cause the delocalized wave functions in the superlattice 24 as illustrated in FIG. 4, which in turn can change the wave function overlap to enhance current flow.

Because the cascade-switching effect of the FET occurs in the superlattice of the interior region 24, alternative embodiments may be implemented in which the source and/or drain may include part of all of the superlattice. The superlattice can extend to the doped source and drain regions or alternatively, the source and/or the drain region can consist of the respective homogeneous materials. Similarly, the extent of the doping regions can vary as well.

Figure 8:
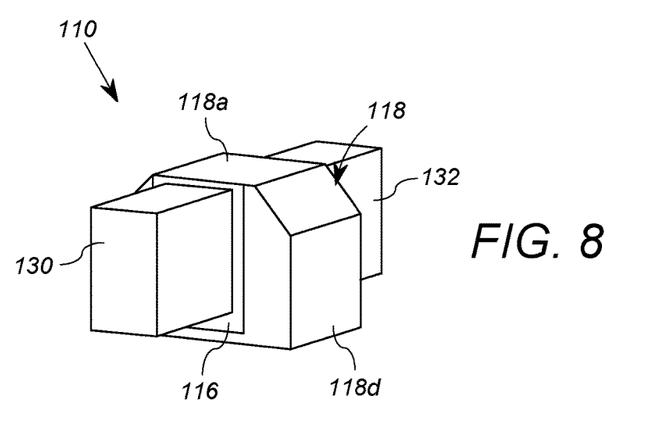
FIG. 8 shows a representative perspective view of a second alternative embodiment of the FET of FIG. 1.

In still other embodiments, the geometry of the gates 18, 20 and/or the insulator/dielectric 16 can be varied, so long as they impose an inhomogeneity in the electrostatic potential within the undoped (or lightly doped) region 24 under the gate 18, 20 (See FIG. 2) that switches between the profiles shown in FIGS. 4 and 5. In FIG. 1, the gate is formed of two gate segments 18, 20 having different (i.e. non-symmetrical) geometries. However, the inhomogeneity of the electrostatic potential may be effectuated using a single gate structure having an asymmetrical design and/or a dielectric layer having an asymmetrical design along the vertical dimension. By way of non-limiting example, FIG. 8 shows a device 110 that is the same as the FET 10 except that the gate 118 is a single structure that surrounds the interior region 24 (not shown in FIG. 8) and has a vertically inhomogeneous shape. In this embodiment, the gate 118 has a thin top layer 118*a*, a thin bottom layer 118*b*, two thicker side layers (one not shown), 118*d*, and chamfered edges between the side layers 118*d* and the top layer 118.

Figures 9, 10:
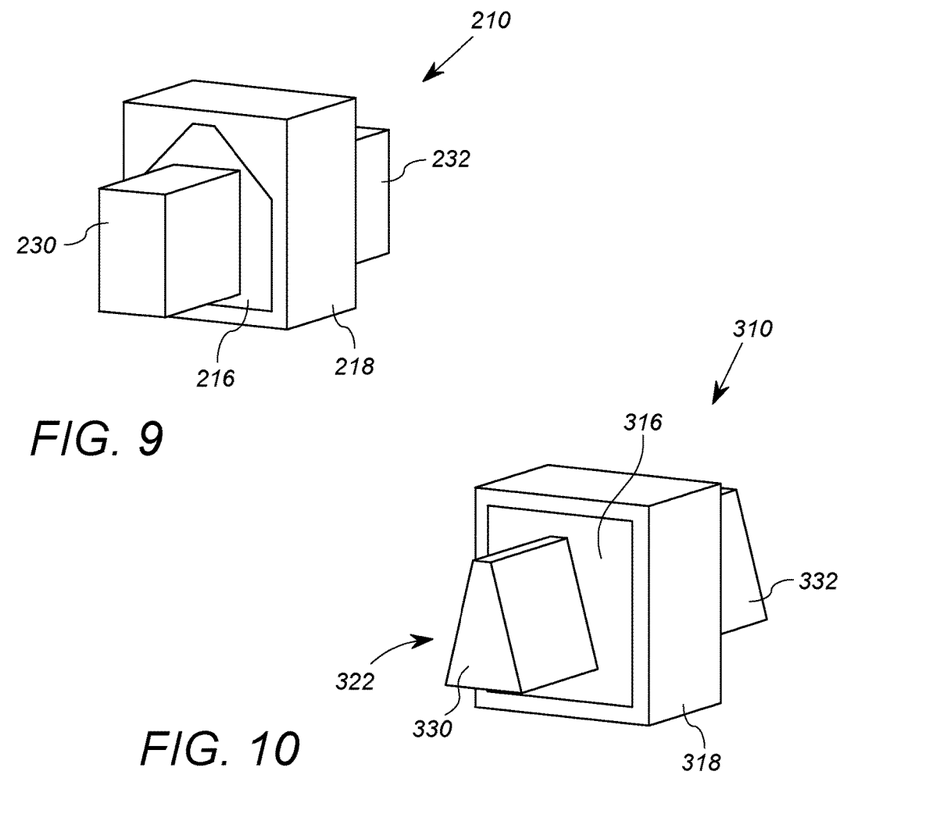
FIG. 9 shows a representative perspective view of a third alternative embodiment of the FET of FIG. 1.
FIG. 10 shows a representative perspective view of a fourth alternative embodiment of the FET of FIG. 1.

In another non-limiting example, FIG. 9 shows a FET 210 that has the same structure as the FET 10 of FIG. 1 except that both the insulation (dielectric) layer 216 and the gate 218 have a non-homogeneous shape. The insulation layer 216 has wider side and top portions, and chamfered corners between the sides and the top portions. The single piece gate 218 has an outer perimeter that is rectangular, and an inner perimeter that is conformal to the shape of the insulation layer 216. It will be appreciated that in the embodiments described herein, the gate structures are formed directly on the dielectric layers.

FIG. 10 shows yet a different embodiment of a FET 310 which the shape of the fin has been modified to have a trapezoidal shape, forming trapezoidal fin 322. The fin 322 has tapered sides in the first region 330, the second region 332, and the interior region, not shown, but which has the same layered structure the interior 24 of FIGS. 2 and 3, and is disposed under the gate 318. The insulation layer 316 conforms to the trapezoidal shape of the fin 322, but has an external perimeter that is the same as the insulation layer 16 of FIG. 1. The remaining elements of the FET 310 are similar to those of the FET 10 of FIG. 1. Another way to vary the geometry of the superlattice itself can be to vary the thickness of the individual superlattice layers. Referring to FIG. 1, the thickness of layers 24*a* can differ from each other, and/or the thickness of layers 24*b* can differ from each other.

As discussed above, the superlattice 24 can have alternating layers 24*a*, 24*b* of InAs/GaSb, InAs/AlSb, InAs/GaInSb, InAsSb/InSb, InAlN/GaN, AlGaAs/AlAs, AlGaAs/GaAs, ZnSe/ZnTe, SiGe/Si. In addition, alloys of these materials can serve the purpose of this technology as well. It will further be appreciated that 2D material superlattices of various growth orientations can potentially form superlattices. Known 2D materials are all transition metal dichalcogenides, phosphorene, graphene, silicene, germanene, and stanene. Varying their layer symmetry and thickness may allow to tune the band structures of heterojunctions to superlattices having alternate layers with alternate wave functions. Known examples are for type 2 band alignment are $MoS_2/MoTe_2$. Even homojunctions can form interlayer (type 2) excitons depending on the material details, as discussed in Wang, K.-C. et al. Control of interlayer physics in 2H transition metal dichalcogenides. *J. Appl. Phys.* 122, 224302 (2017).

The FET 10 and other FETs described herein may readily be fabricated using known standard transistor fabrication processes. To this end, all of layers of the FET 10 are aligned with the growth direction (e.g. bottom up). In other words, each layer gets grown on top of the layers underneath. Areas where we want to have a specific material being grown will get defined with inverter masks.

The above-describe embodiments are merely exemplary. Those of ordinary skill in the art may readily devise their own modifications and implementations that incorporate the principles of the present invention and fall within the spirit and scope thereof.

The invention claimed is:

1. A field-effect transistor (FET) comprising:
   a fin having a doped first region, a doped second region, and an interior region between the doped first region and the doped second region, the interior region being undoped or more lightly doped than the doped first region and the doped second region, at least the interior region of the fin formed as a superlattice of layers of first and second materials alternating vertically;
   an insulator layer formed around the interior region;
   a plurality of gates formed on at least a portion of the insulator layer the plurality of gates comprising a first gate and a separate second gate, a top portion of the first gate extending over a top of the interior region, and a bottom portion of the second gate extending under a bottom of the interior region, wherein the top portion and a bottom portion have different thicknesses,
   wherein the insulator layer and the gates are configured to generate an inhomogeneous electrostatic potential within the interior region, the inhomogeneous electrostatic potential cooperating with physical properties of the superlattice to cause scattering of charge carriers sufficient to change a quantum property of such charge carriers to change the ability of the charge carriers to move between the first and second materials.

2. The FET of claim 1, wherein the quantum property of the charge carriers in the first material differs from the quantum property of the charge carriers in the second material.

3. The FET of claim 2, wherein the quantum property is a momentum of the charge carriers.

4. The FET of claim 2, wherein the quantum property is the band valley in which the charge carriers reside.

5. The FET of claim 2, wherein the quantum property is a spin direction of the charge carriers.

6. The FET of claim 2, wherein the inhomogeneous electrostatic potential cooperates with physical properties of the superlattice to change the overlap of the wave functions of the first and second materials in comparison to the absence of the inhomogeneous electrostatic potential, sufficient to change the conductance between the doped first region and the doped second region.

7. The FET of claim 6, wherein the inhomogeneous electrostatic potential cooperates with the physical properties of the superlattice to cause scattering of the charge carriers on phonons.

8. The FET of claim 6, wherein the inhomogeneous electrostatic potential cooperates with the physical properties of the superlattice to cause scattering of the charge carriers, wherein said physical properties of the superlattice includes roughness at boundaries between the layers of first and second materials, said roughness contributing to the scattering of the charge carriers.

9. The FET of claim 6, wherein the inhomogeneous electrostatic potential cooperates with the physical properties of the superlattice to cause scattering of the charge carriers, wherein said physical properties of the superlattice includes roughness at boundaries between the layers of first and second materials, said roughness contributing to the scattering of the charge carriers.

10. The FET of claim 6, wherein the inhomogeneous electrostatic potential cooperates with the physical properties of the superlattice to cause scattering of the charge carriers, wherein said physical properties of the superlattice includes impurities in at least one of the first and second materials in the superlattice.

11. The FET of claim 1, wherein the interior region is undoped.

12. The FET of claim 1, wherein each of the gates comprises a metal or a heavily doped semiconductor.

13. The FET of claim 1, wherein the doped first region is formed from the first material, and the doped second region is formed from the second material.

14. The FET of claim 13, wherein the doped first region is p-doped, and the doped second region is n-doped.

15. The FET of claim 1, wherein the first material and second material have different chemical components.

16. A field-effect transistor (FET) comprising:
- a fin having a doped first region, a doped second region, and an interior region between the doped first region and the doped second region, the interior region being undoped or more lightly doped than the doped first region and the doped second region, at least the interior region of the fin formed as a superlattice of layers of first and second materials alternating vertically;
- an insulator layer formed around the interior region; and
- at least one gate formed on at least a portion of the insulator layer,
- wherein the fin extends in a current direction from the doped first region to the doped second region and through the interior region, wherein the insulator layer and the at least one gate are configured to apply an electric field perpendicular to the current direction when voltage is applied to the at least one gate,
- wherein the insulator layer and the at least one gate are configured to generate an inhomogeneous electrostatic potential to cause scattering of charge carriers sufficient to change a quantum property of such charge carriers to change the ability of the charge carriers to move between the first and second materials, and
- wherein the at least one gate comprises a first gate and a separate second gate, a top portion of the first gate extending over a top of the interior region, and a bottom portion of the second gate extending under a bottom of the interior region, wherein the top portion and a second portion have different thicknesses.

* * * * *